United States Patent
Shih et al.

(10) Patent No.: US 10,852,608 B1
(45) Date of Patent: Dec. 1, 2020

(54) DISPLAY PANEL AND MANUFACTURING METHOD THEREOF

(71) Applicant: AU Optronics Corporation, Hsin-Chu (TW)

(72) Inventors: Ping-Hung Shih, Hsin-Chu (TW); Meng-Ting Hsieh, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/699,844

(22) Filed: Dec. 2, 2019

(30) Foreign Application Priority Data

May 15, 2019 (TW) .............................. 108116784 A

(51) Int. Cl.
  *G02F 1/1362* (2006.01)
  *G02F 1/1345* (2006.01)
  *H01L 27/12* (2006.01)

(52) U.S. Cl.
  CPC .... *G02F 1/136286* (2013.01); *G02F 1/13452* (2013.01); *H01L 27/124* (2013.01); *H01L 27/1259* (2013.01); *G02F 2001/136295* (2013.01)

(58) Field of Classification Search
  CPC ........... G02F 1/136286; G02F 1/13452; G02F 2001/136295; H01L 27/124; H01L 27/1259
  See application file for complete search history.

(56) References Cited

U.S. PATENT DOCUMENTS 7,701,526 B2 * 4/2010 Kim ....................... G02F 1/1345
  349/54
10,775,675 B2 * 9/2020 Lee ......................... G02F 1/1362
2006/0231858 A1 * 10/2006 Akimoto ............... H01L 27/124
  257/140
2007/0008446 A1 * 1/2007 Moon .................... G02F 1/1345
  349/43
2015/0041814 A1 * 2/2015 Kim ..................... H01L 27/1244
  257/59
2017/0102578 A1 * 4/2017 Shin .................. H01L 29/78669
2017/0115542 A1 * 4/2017 Oh .................... G02F 1/136286
2018/0190631 A1 * 7/2018 Kim ..................... G02F 1/13336
2018/0191747 A1 * 7/2018 Nachenberg ........ H04L 63/1408

FOREIGN PATENT DOCUMENTS

| CN | 1797528 A | 7/2006 |
| CN | 106206619 A | 12/2016 |
| CN | 107102493 A | 8/2017 |
| CN | 108089769 A | 5/2018 |

* cited by examiner

*Primary Examiner* — Victor A Mandala

(74) *Attorney, Agent, or Firm* — McClure, Qualey & Rodack, LLP

(57) ABSTRACT

A display panel includes an array substrate, a first pixel unit, a first data line, a common line, a first fanout line, and an opposite substrate. The array substrate includes a substrate including a first display region, a second display region, and a non-display region. The second display region includes a first side and a second side connected to the first side. The non-display region is adjacent connected to the first side. The first display region is adjacent connected to the second side. The first display region has a third side opposite to the second side. The third side is substantially aligned with an edge of the substrate. A first fanout line is disposed on the non-display region and connected to the first data line. The first fanout line has an end substantially aligned with the edge of the substrate.

10 Claims, 10 Drawing Sheets

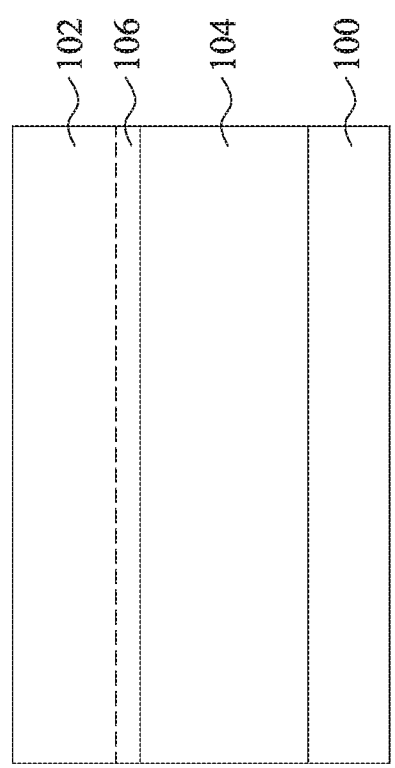

DISPLAY PANEL AND MANUFACTURING METHOD THEREOF

CROSS-REFERENCE TO RELATED APPLICATION

This application claims priority to Taiwan Application Serial Number 108116784, filed May 15, 2019, which is herein incorporated by reference in its entirety.

BACKGROUND

Field of Invention

The present invention relates to a display panel and a manufacturing method thereof.

Description of Related Art

In terms of displays, a thin-film transistor liquid crystal display (TFT-LCD) having high resolution, high space utilization efficiency and low power consumption and no radiation has gradually become mainstream market products.

The thin-film transistor array substrate has a plurality of pixel units, scan lines and data lines arranged in an array. The thin-film transistor of each pixel unit is controlled by the corresponding scan line and data line. The data line and the scan line are connected to the source driving circuit and the gate driving circuit through fanout lines.

Generally, methods of forming the thin-film transistor array substrate with different sizes may be, for example, cutting a display with a large size or designing a mask. However, designing the mask is expensive. Cutting the display with the large size may cause fanout line to be cut off such that the pixel units cannot be controlled.

SUMMARY

The invention provides a display panel. The display panel includes an array substrate and an opposite substrate. The array substrate includes a first data line and a first pixel unit connected to the first data line. By making the first data line of the array substrate electrically connected to the common line, a common voltage can be supplied to the first data line. By controlling the common potential of the opposite substrate and the common potential of the array substrate are at equal potentials, the first pixel unit can be in a dark state. In this way, the first display region formed by the first pixel unit can display a black image. A problem that the display quality of the cut portion of the display panel is reduced can be avoided.

In one embodiment, a display panel includes an array substrate, a pixel unit, a first data line, a common line, and a first fanout line. The array substrate includes a substrate. The substrate includes a first display region, a second display region, and a non-display region. The first display region includes a first side and a second side connected to the first side. The non-display region is adjacent connected to the first side. The second display region is adjacent connected to the second side. The second display region has a third side opposite to the second side. The third side is substantially aligned with an edge of the substrate. The first pixel unit is disposed on the first display region. The first data line is disposed on the first display region and electrically connected to the first pixel unit. The common line is disposed on the first display region and the second display region and intersects the first data line. The common line is electrically connected to the first data line. The first fanout line is disposed on the non-display region and connected to the first data line. The first fanout line has an end substantially aligned with the edge of the substrate. The opposite substrate is disposed opposite to the array substrate.

A method of manufacturing a display panel including providing a mother board and an opposite substrate opposite to the mother board, in which the mother board includes a substrate, the substrate includes a display region and a non-display region, the mother board includes a first data line, a second data line, a common line, a first pixel unit, and a second pixel unit disposed on the display region and a driving circuit, a first fanout line, and a second fanout line disposed on the non-display region, in which the common line intersects the first data line and the second data line, respectively, the first data line and the second data line are electrically connected to the first pixel unit and the second pixel unit, respectively, the first data line and the second data line are electrically connected to the driving circuit through the first fanout line and the second fanout line, respectively; cutting the mother board such that the first fanout line has an end substantially aligned with the substrate; and making the first data line electrically connected to the common line.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 1 is a cross-sectional view of a display panel according to one embodiment of present invention.

DETAILED DESCRIPTION

Figure 2A:
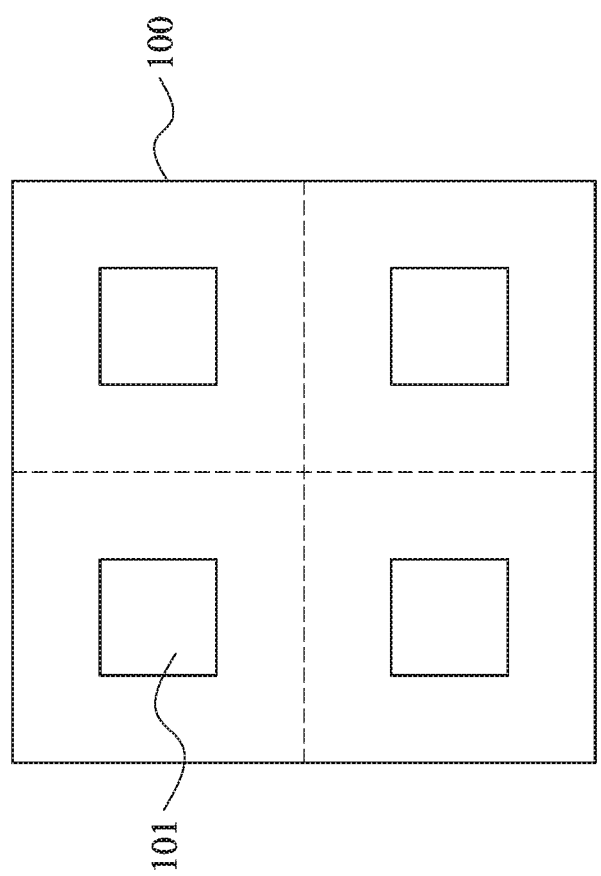
FIG. 2A is a top view of a mother board in FIG. 1.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a display panel 10 according to one embodiment of the present invention. Reference is made to FIG. 1. The display panel 10 includes a mother board 100, an opposite substrate 102, and a liquid crystal layer 104. In the present embodiment, the opposite substrate 102 is a substrate including an opposite electrode 106. The liquid crystal layer 104 is disposed between the mother board 100 and the opposite substrate 102. The display panel 10 of the present invention can be any kind of liquid crystal display pane, for example, but is not limited to, a polymer stabilized alignment (PSA) liquid crystal display panel. The opposite substrate 102 may include, but is not limited to, a color filter substrate.

Figure 2B:
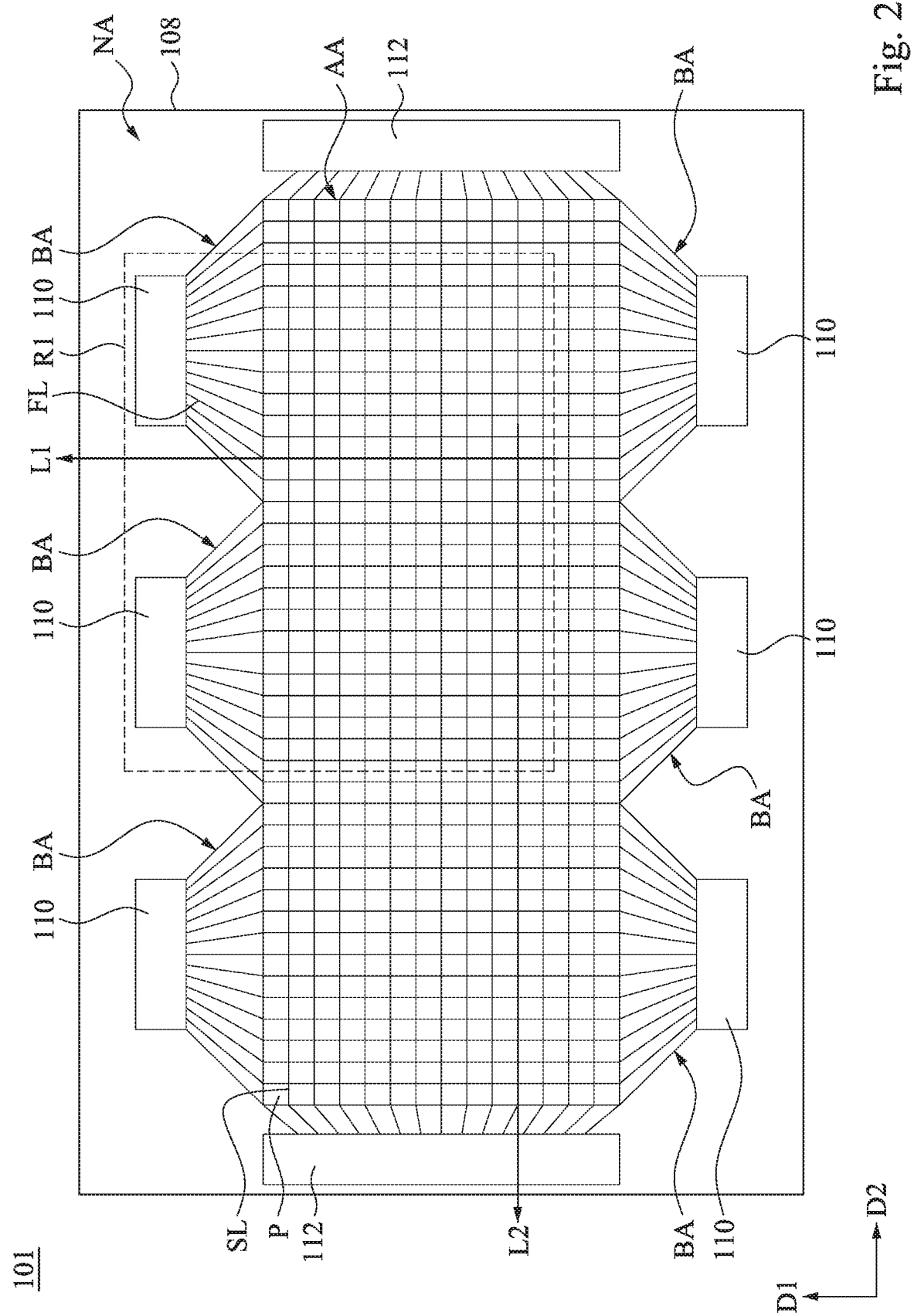
FIG. 2B is a top view of an array unit.
Figure 3:
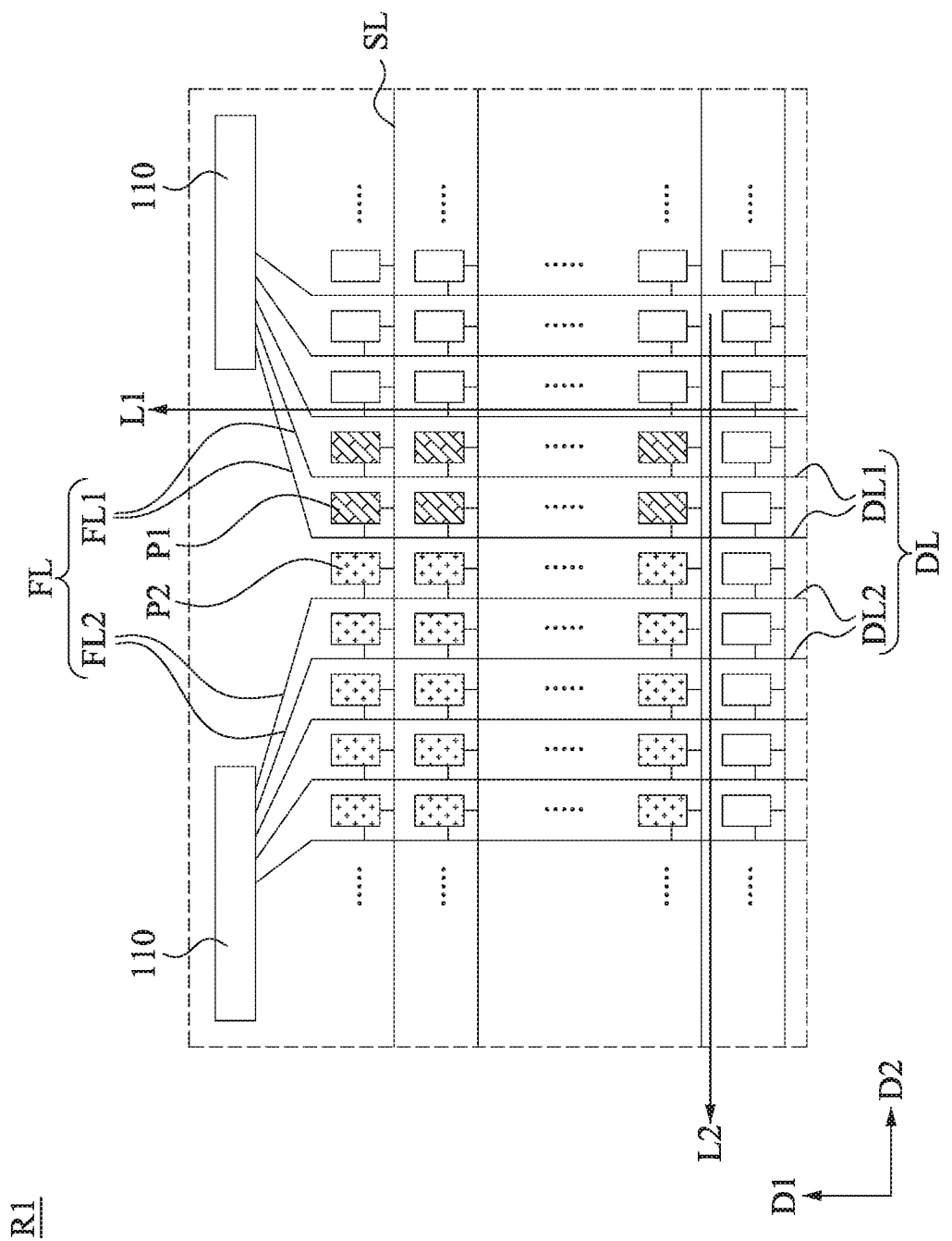
FIG. 3 is an enlarged view of a region R1 in FIG. 2B.

FIG. 2A is a top view of the mother board 100 in FIG. 1. A plurality of array units 101 are formed on the mother board 100. FIG. 2B is a top view of the array units 101. FIG. 3 is an enlarged view of a region R1 in FIG. 2B. Reference is made to FIGS. 2A, 2B, and 3. Although four array units 101 are illustrated in the present embodiment, however, the present embodiment does not limit the number of the array units 101 on the mother board 100. Generally, the number of the array units 101 on the mother board 100 is related to a size of the mother board 100 and a size of the array unit 101. The mother board 100 includes a substrate 108 and a plurality of pixel units P, data lines DL, fanout lines FL, scan lines SL, source driving circuits 110, and gate driver on array (GOA) circuits 112 disposed on the substrate 108. The data lines DL and the scan lines SL intersect with each other and are electrically coupled to the pixel units P. The data lines DL are configured to transmit data signals to the pixel units P. The scan lines SL are configured to transmit scan signals to the pixel units P. The fanout lines FL are connected to the data lines DL. The source driving circuits 110 are electrically coupled to the data lines DL through the fanout lines FL. The gate driver on array circuits 112 are electrically coupled to the scan lines SL. As a result, the source driving circuits 110 and the gate driver on array circuits 112 are electrically coupled to the pixel units P.

The substrate 108 includes a display region AA and a non-display region NA. In some embodiments, the source driving circuits 110 and the gate driver on array circuits 112 are disposed on the non-display region NA. The non-display region NA is on peripheral regions of the display region AA such as bonding area BA of the display region AA and the source driving circuits 110. The fanout lines FL are on the bonding region BA. In some embodiments, the substrate 108 may be a transparent substrate, for example, but is not limited to, a glass substrate, a plastic substrate, a quartz substrate, or other suitable substrates.

For the sake of description, a first direction D1 and a second direction D2 are illustrated in FIG. 2B and FIG. 3. The first direction D1 is different from the second direction D2. For example, the first direction D1 and the second direction D2 are a longitudinal direction and a lateral direction, respectively, in FIG. 2B and FIG. 3, and are orthogonal to each other. In one embodiment, the data lines DL extend along the first direction D1 and arranged along the second direction D2 on the display region AA of the substrate 108. The scan lines SL extend along the second direction D2 and arranged along the first direction D1 on the display region AA of the substrate 108.

In the present embodiment, the display panel 10 is cut along a first cutting line L1 and a second cutting line L2 to obtain a display panel 10a with a desired size. The first cutting line L1 is substantially parallel to the first direction D1. The second cutting line L2 is substantially parallel to the second direction D2. The first cutting line L1 and the second cutting line L2 pass through the display region AA. Methods of cutting may be, for example, using cutting wheels, diamond cutters, or laser. In the present embodiment, since the display panel 10a with the desired size is obtained using cutting, by moving positions of the first cutting line L1 and the second cutting line L2, the display panel 10a with the desired size is obtained without designing new mask patterns. Therefore, the advantages of display panel size flexibility and cost saving can be achieved at the same time. In the present embodiment, an end of the first cutting line L1 and an end of the second cutting line L2 pass through an end of the substrate 108. Another end of the first cutting line L1 and another end of the second cutting line L2 do not pass through the edge of the substrate 108. But the present disclosure is not limited to that. In other embodiments, the two ends of the first cutting line L1 and the two ends of the second cutting line L2 both pass the edge of the substrate 108.

Figure 4:
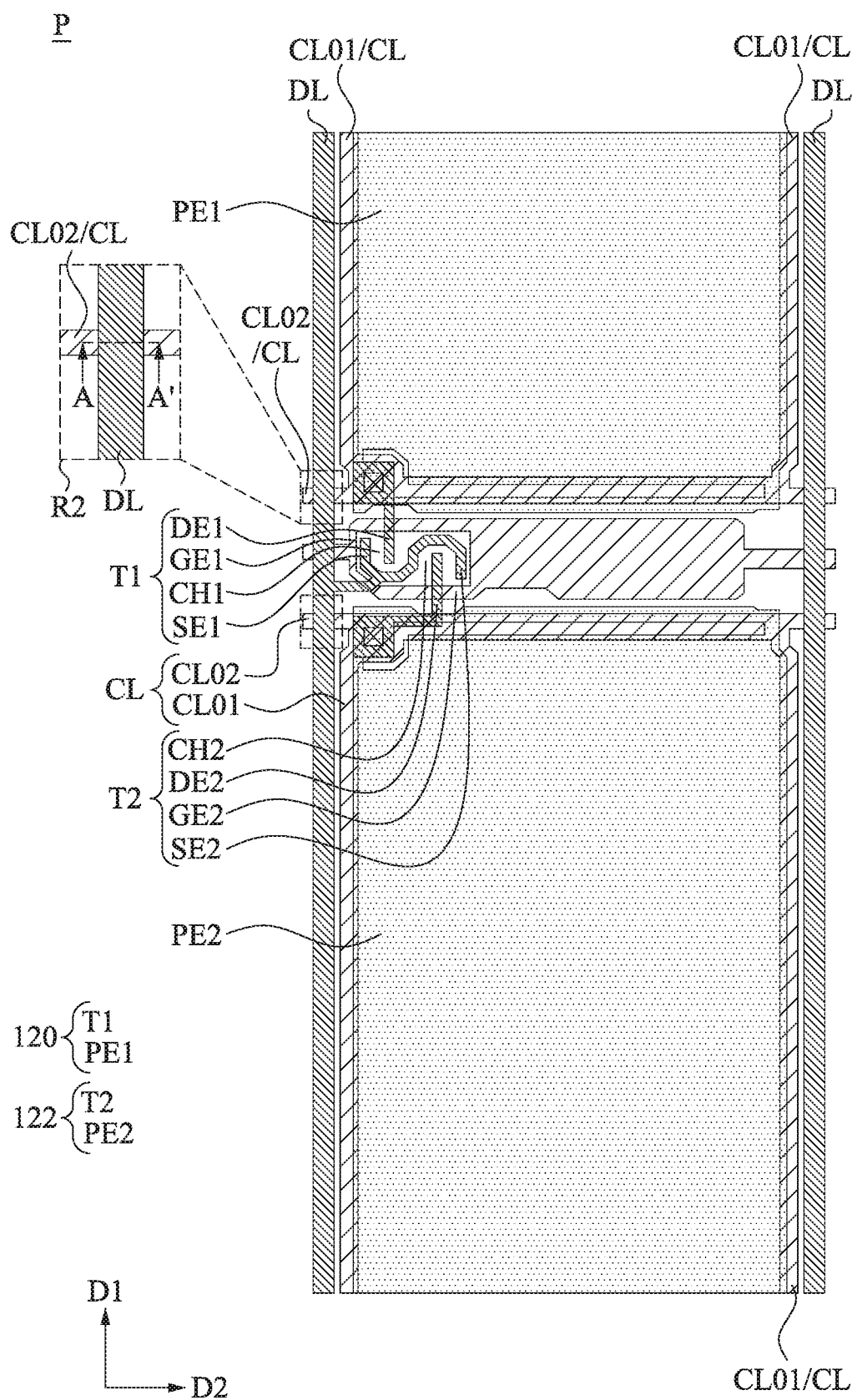
FIG. 4 is a schematic diagram of a pixel unit.

It is noted that, the pixel units P disconnected from the source driving circuit 110 is regarded as first pixel units P1. The data lines DL electrically connected to the first pixel units P1 are regarded as first data lines DL1. The fanout lines FL connected to the first data lines DL1 are regarded as first fanout lines FL1. Before cutting the mother board 100, the first data lines DL1 are electrically connected to the source driving circuits 110 through the first fanout lines FL1. In other words, the pixel units P having fanout lines FL passed through by the first cutting line L1 are regarded as the first pixel units P1. The pixel units P still electrically connected to the source driving circuits 110 are regarded as the second pixel units P2. The data lines D2 electrically connected to the second pixel units P2 are regarded as second data lines DL2. The fanout lines FL connected to the second data lines DL2 are regarded as second fanout lines FL2. In some other embodiments, the display panel 10 is cut in a condition without disposing the liquid crystal layer 104 between the mother board 100 and the opposite substrate 102. The liquid crystal layer 104 is disposed therebetween after the cutting. FIG. 4 is a schematic diagram of a pixel unit P. Reference is made to FIG. 4. Each of the pixel units P includes a first sub pixel 120 and a second sub pixel 122. The first sub pixel 120 includes a first active device T1 and a first pixel electrode PE1. For example, the first active device T1 includes a gate GE1, a channel layer CH1, a source SE1, and a drain DE1. The gate GE1 is electrically connected to the scan line SL. The source SE1 is electrically connected to the data line DL. For example, the channel layer CH1 is disposed on the gate GE1 and is between the source SE1 and the drain DE1. The pixel electrode PE1 is electrically connected to the drain DE1. The second sub pixel 122 includes a second active device T2 and a second pixel electrode PE2. The second active device T2 includes, for example, a gate GE2, a channel layer CH2, a source SE2, and a drain DE2. The gate GE2 is electrically connected to the scan line SL. The source SE2 is electrically connected to the data line DL. The channel layer CH2 is, for example, disposed on the gate GE2 and is between the source SE2 and the drain DE2. The second pixel electrode PE2 is electrically connected to the drain DE2. The first active device T1 and the second active device T2 of the present invention are, but is not limited to, bottom gate transistors. In the present embodiment, the opposite electrode 106 (see FIG. 1) has a constant potential, that is, CF VCOM. When a pixel voltage (Vp) different from the CF VCOM is applied on the first pixel electrode PE1 and the second pixel electrode PE2, vertical electric fields may be produced between the first and the second pixel electrodes PE1, PE2, and the opposite electrode 106 such that a liquid capacity is formed between the first and the second pixel electrodes PE1, PE2, and the opposite electrode 106 to drive the liquid crystal molecules of the liquid crystal layer 104 between the mother board 100 and the opposite electrode 106.

In the present embodiment, the first pixel electrode PE1 and the second pixel electrode PE2 may be, for example, transparent conductive layers including a metal oxide layer such as indium tin oxide (ITO), indium zinc oxide (IZO), aluminum tin oxide, aluminum zin oxide-indium germanium zinc oxide, other suitable oxides, or multiple layers or combinations thereof. However, the present invention is not limited to that. In other embodiments, the first pixel electrodes PE1 and the second pixel electrodes PE2 may be non-transparent/reflective conductive layer including metal, other suitable materials or combinations thereof.

The mother board 100 further includes common lines CL (or known as storage capacitor lines) disposed on the display region AA of the substrate 108. The common lines CL have a constant potential, which is an array VCOM. The storage capacitance can be formed between the first pixel electrode PE1 and the common line CL and between the second pixel electrode PE2 and the common line CL and is configured to stabilize levels of data voltages of the first and the second pixel electrodes PE1, PE2 during the first and second active devices T1, T2 are turned off to maintain display quality. But the present invention is not limited that.

Figure 5:
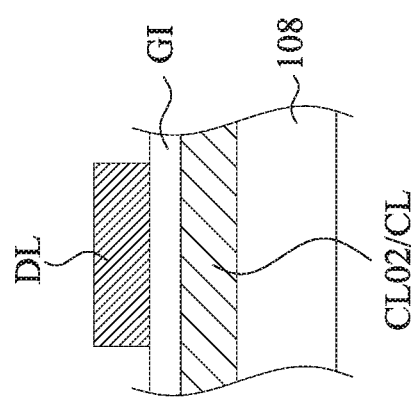
FIG. 5 is a cross-sectional view of a common line and a data line in FIG. 4 along line A-A'.

In the present embodiment, the common lines CL have a mesh shape. In the large size display panel 10, RC delay can be avoided effectively. For example, the common line CL has a first portion CL01 extending along the first direction D1 and a second portion CL02 extending along the second direction D2. The first portion CL01 of the common line CL is substantially parallel with the data line DL. The second portion CL02 of the common line CL is substantially parallel with the scan line SL. In other words, the second portion CL02 of the common line CL intersects the data line DL. In one embodiment, the second portion CL02 of the common line CL is substantially perpendicular to the data line DL. A region R2 is a partially enlarged view of the second portion CL02 of the common line CL and the data line DL. FIG. 5 is a cross-sectional view of the second portion CL02 of the common line CL and the data line DL in FIG. 4 along line A-A'. Reference is made to FIG. 5. A normal projection of the second portion CL02 of the common line CL on the substrate 108 partially overlaps a normal projection of the data line DL on the substrate 108. In some embodiments, the mother board 100 includes a gate insulation layer GI disposed on the substrate 108. The gate insulation layer GI is in contact with the substrate 108 and is over the common line CL, the gate GE1, and the scan line SL. The data line DL is over the gate insulation layer GI. The gate insulation layer GI is between the data line DL and the common line CL. For example, a material of the gate insulation layer GI includes inorganic materials (e.g., silicon oxide, silicon nitride, silicon oxynitride, other suitable materials, or combinations thereof.)

The common line CL, the gate GE1, and the scan line SL may be formed by patterning the same film, for example, a first conductive layer. And the common line CL is spaced apart from the gate GE1 and spaced apart from the scan lines SL as well. The data line DL, the fanout line FL, the drain DE1, and the source SE1 are formed by patterning the same film, for example, a second conductive layer. In the present embodiment, in view of the conductivity, the first conductive layer and the second conductive layer may be made of metal materials. However, the present invention is not limited to this. In other embodiments, the first conductive layer and the second conductive layer may be made of other conductive materials, for example, alloys, metal nitrides, metal oxides, metal oxynitrides, or a stack of metal materials and other conductive materials.

Figure 6:
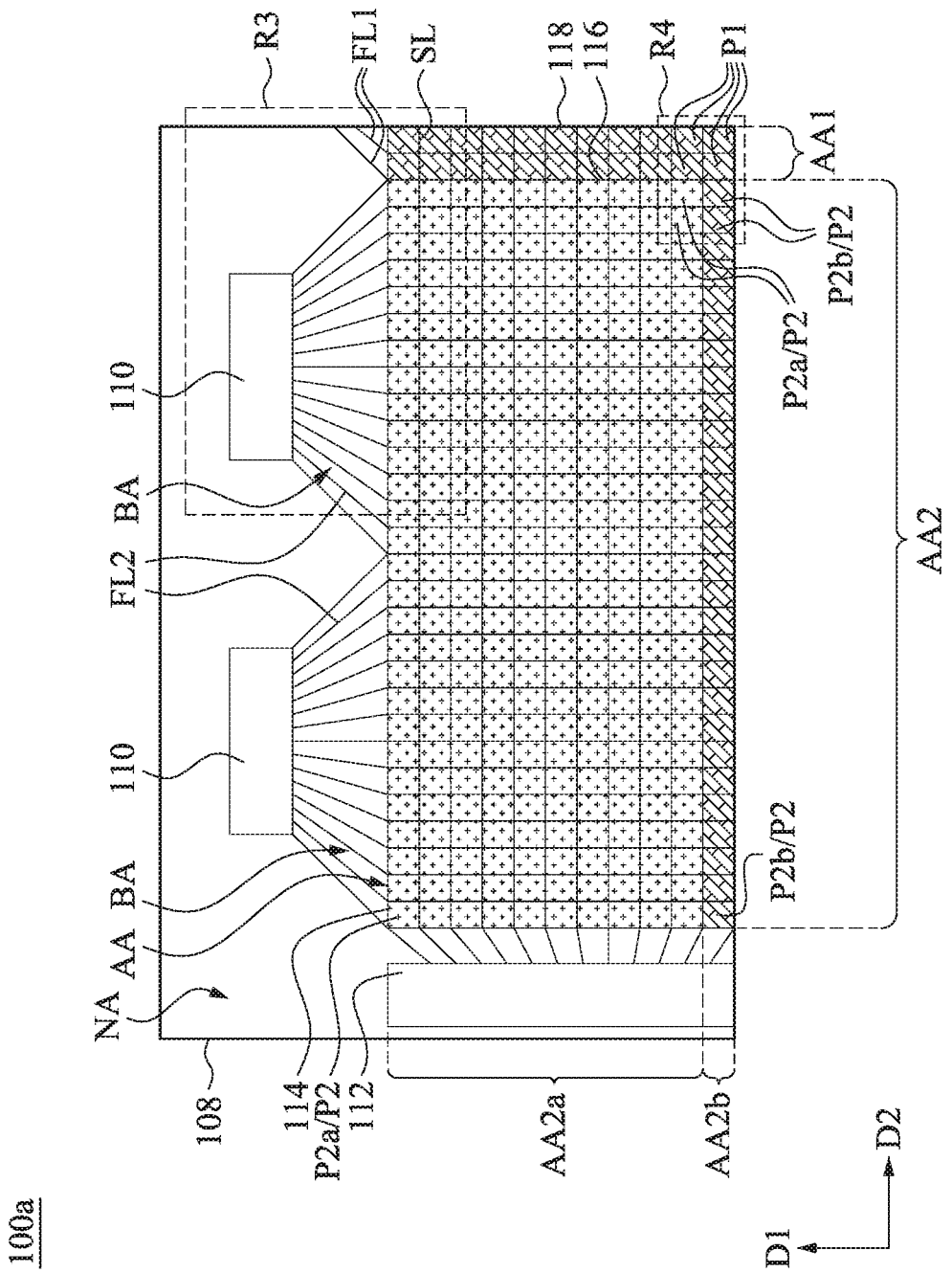
FIG. 6 is a top view of an array substrate.
Figure 7:
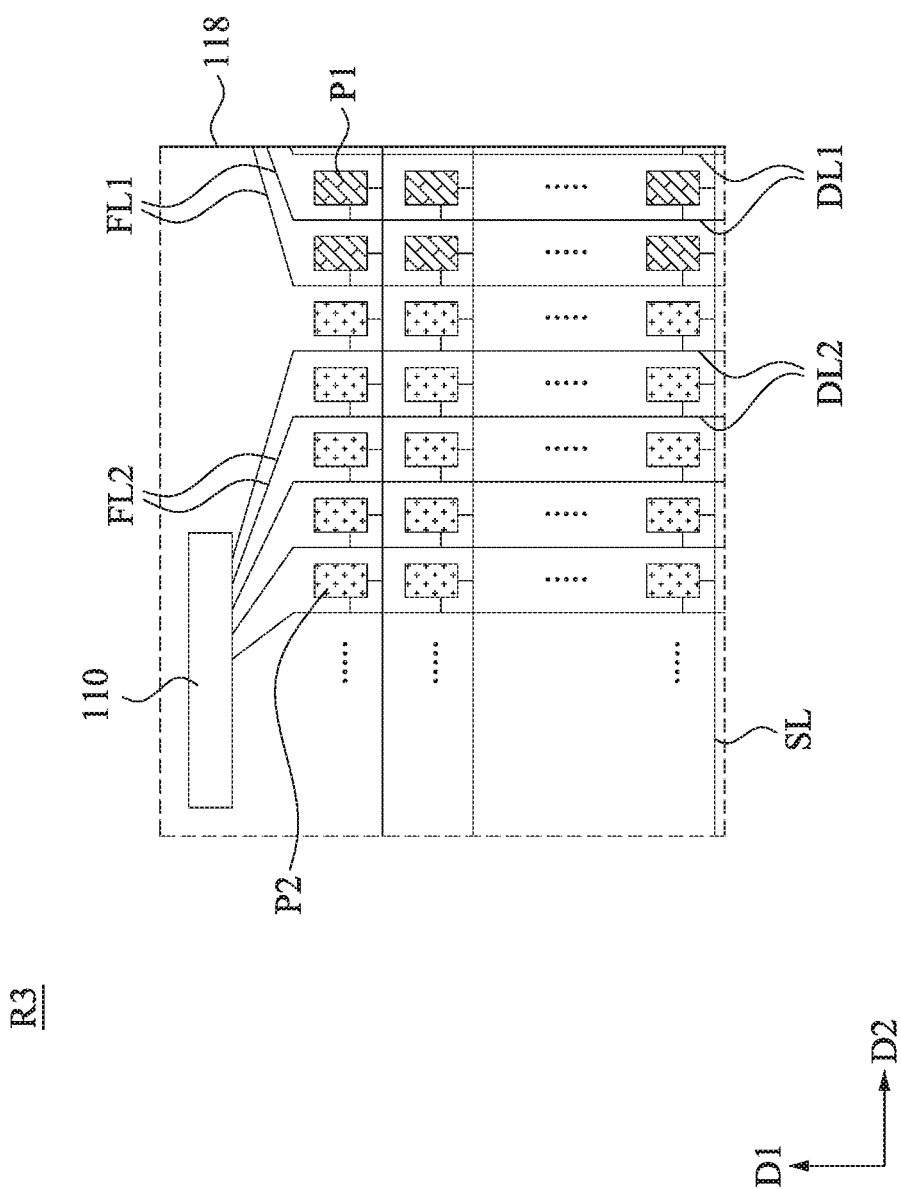
FIG. 7 is an enlarged view of a region R3 in FIG. 6.
Figure 8:
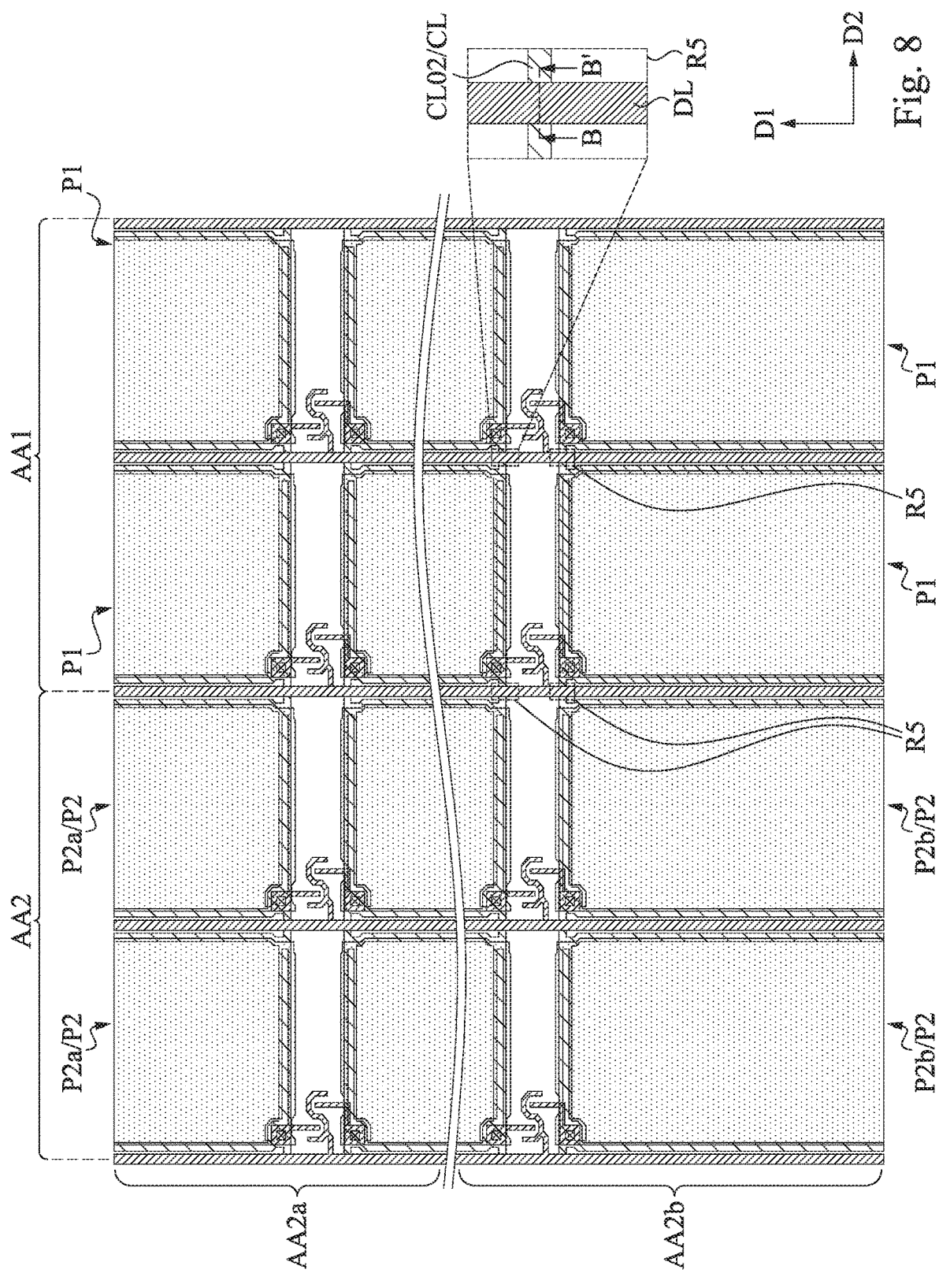
FIG. 8 is an enlarged view of a region R4 in FIG. 6.
Figure 9:
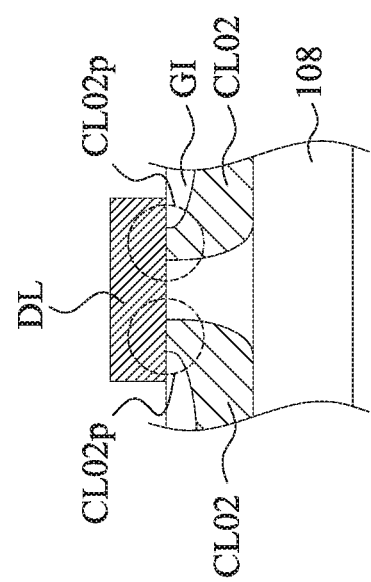
FIG. 9 is a cross-sectional view of a common line and a data line in FIG. 8 along line B-B'.

After cutting the display panel 10, the display panel 10 may include an array substrate 100a and the opposing substrate (not shown) with desired sizes. FIG. 6 illustrates the array substrate 100a after being repaired in accordance with one embodiment of the present disclosure. FIG. 7 is an enlarged view of a region R3 in FIG. 6. FIG. 8 is an enlarged view of a region R4 in FIG. 6. FIG. 9 is a cross-sectional view of the common line CL and the data line DL in FIG. 8 along line B-B'. Reference is made to FIGS. 6-9. Because the first cutting line L1 passes through the first fanout lines FL1, the first fanout lines FL1 have ends substantially aligned with the edge of the substrate 108. In other words, the first fanout lines FL1 have disconnected portions.

As discussed above, the pixel units connected to the cut-off first fanout lines, which equals to the first fanout lines FL1 having the disconnected portions, are defined as first pixel units P1. The pixel units connected to the non-cutoff second fanout lines FL2 are defined as second pixel units P2. That is, the pixel units which are still connected to the source driving circuits 110 are defined as second pixel units P2. The first pixel units P1 constitute a first display region AA1. The second pixel units P2 constitute a second display region AA2. In other words, the display region AA may have the first display region AA1 and the second display region AA2. The first pixel units P1 are on the first display region AA1. The second pixel units P2 are on the second display region AA2. In particular, the first display region AA1 has a first side 114 and a second side 116 connected to the first side 114. The non-display region NA is adjacent connected to the first side 114 of the first display region AA1. The second display region AA2 is adjacent connected to the second side 116 of the first display region AA1. The second display region AA2 has a third side 118 opposite to the second side 116. The third side 118 of the second display region AA2 is substantially aligned with the edge of the substrate 108. In one embodiment, the first side 114 is substantially perpendicular to the second side 116. In particular, the second pixel units P2 on the second display region AA2 can receive data signals transmitted from the source driving circuits 110 and then display an image. The first pixel units P1 on the first display region AA1 are disconnected from the source driving circuits 110 and cannot receive the data signals from the source driving circuits 110. Therefore, the image displayed by the first display region AA1 cannot be controlled. In other words, since the connection between the first fanout lines FL1 and the source driving circuits 110 is cut-off, the source driving circuits 110 cannot provide data signals to the first pixel units P1 by the first data lines DL1 connected to the first fanout lines FL1. Therefore, the source driving circuits 110 cannot control the grayscale value of the first pixel units P1.

The region R5 is a partial enlarged view of the second portion CL02 of the common lines CL and the data line DL. In one embodiment, the first data lines DL1 and the second portion CL02 of the common lines CL are welded to each other such that the first data lines DL1 are electrically connected to the common lines CL. In one embodiment, the laser is directed from the bottom surface of the substrate 108 to the display panel 10a such that the first data lines DL1 and the second portion CL02 of the common lines CL are welded to each other to repair the first display region AA1 of the display panel 10a. In other embodiments, processes of making the first data lines DL1 and the second portion CL02 of the common lines CL welded to each other include gas welding, resistance welding, arc welding, induction brazing or other suitable processes. In one embodiment, the first data lines DL1 are welded to the second portion CL02 of the common lines CL such that the second portion CL02 of the common lines CL have a protrusion portion CL02p. The protrusion portion CL02p extends toward the first data line DL1 and in contact with the first data line DL1 such that the first data line DL1 is electrically connected to the common line CL. In other words, the common line CL and the first data line DL1 are at equal potentials. Since the first data lines DL1 provide potential for the first pixel electrodes PE1 and the second pixel electrodes PE2, the first pixel electrodes PE1 and the second pixel electrodes PE2 have Array VCOM. Therefore, the potentials of the first pixel electrodes PE1 and the second pixel electrodes PE2 are the same as the CF VCOM of the opposite electrode 106. In other words, the first pixel electrodes PE1 and the second pixel electrodes PE2 have no potential difference between the opposite electrode 106, respectively. In the embodiment where the display apparatus is a normally black mode, the first pixel units P1 are in a dark state. In particular, even if the first fanout lines FL1 of the first pixel units P1 are disconnected from the source driving circuits 110, the first pixel units P1 can still be in the dark state. The first display region AA1 constituted by the first pixel units AA1 can therefore display the black image. A problem that the display quality of the cut portion of the array substrate 100a is reduced can be avoided. In one embodiment, an area of the second display region AA2 is substantially greater than an area of the first display region AA1 to provide the display image with enough area.

The second pixel units P2 have a first group P2a and a second group P2b. The first group P2a of the second pixel units P2 and the first pixel units P1 having the common lines CL welded to the first data lines DL1 are on different rows. The second group P2b of the second pixel units P2 and the first pixel units P1 having the common lines CL welded to the first data lines DL1 are on the same row (for example, controlled by the same scan line SL). The first group P2a of the second pixel units P2 constitutes a main display region AA2a of the second display region AA2 and is configured to display the image of the display panel 10a. The second group P2b of the second pixel units P2 is in a dark state. Therefore, the second group P2b of the second pixel units P2 constitutes a sub display region AA2b of the second display region AA2 and displays the black image.

The display panel 10a has first fanout lines FL1 disposed on the non-display region NA and first data lines DL1 and first pixel units P1 disposed on the display region AA. The first pixel units P1 are connected to the first fanout lines DL1 through the first data lines DL1. The end of the first fanout lines FL1 is aligned with the edge of the substrate 108. By making the first data lines FL1 be electrically connected to the common lines CL, the first data lines DL1 can receive the common voltage. By controlling the CF VCOM of the opposite substrate 102 same as the common voltage, the first pixel units P1 can be in the dark state. Therefore, the first display region AA1 formed by the first pixel units P1 can display the black image. A problem that the display quality of the cut portion of the display panel 10a is reduced can be avoided.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel, comprising:
   an array substrate comprising a substrate, wherein the substrate comprises a first display region, a second display region, and a non-display region, the second display region comprises a first side and a second side connected to the first side, the non-display region is adjacent connected to the first side, the first display region is adjacent connected to the second side, the first display region has a third side opposite to the second side, the third side is substantially aligned with an edge of the substrate;
   a first pixel unit disposed on the first display region;
   a first data line disposed on the first display region and electrically connected to the first pixel unit;
   a common line disposed on the first display region and the second display region and intersecting the first data line, wherein the common line is electrically connected to the first data line;
   a first fanout line disposed on the non-display region and connected to the first data line, wherein the first fanout line has an end substantially aligned with the edge of the substrate; and
   an opposite substrate disposed opposite to the array substrate.

2. The display panel of claim 1, wherein the common line has a protrusion, and the protrusion extends toward the first data line and is in contact with the first data line.

3. The display panel of claim 1, wherein the first side is substantially perpendicular to the second side.

4. The display panel of claim 1, wherein an area of the second display region is substantially greater than an area of the first display region.

5. The display panel of claim 1, further comprising:
   a second pixel unit disposed on the second display region;
   a second data line disposed on the second display region and electrically connected to the second pixel unit; and
   a second fanout line disposed on the non-display region and connected to the second data line.

6. The display panel of claim 5, further comprising:
   a driving circuit disposed on the non-display region, wherein the second fanout line is electrically connected to the driving circuit.

7. A method of manufacturing a display panel, comprising:
   providing a mother board and an opposite substrate opposite to the mother board, wherein the mother board comprises a substrate, the substrate comprises a display region and a non-display region, the mother board comprises a first data line, a second data line, a common line, a first pixel unit, and a second pixel unit disposed on the display region and a driving circuit, a first fanout line, and a second fanout line disposed on the non-display region, wherein the common line intersects the first data line and the second data line, respectively, the first data line and the second data line are electrically connected to the first pixel unit and the second pixel unit, respectively, the first data line and the second data line are electrically connected to the driving circuit through the first fanout line and the second fanout line, respectively;
   cutting the mother board such that the first fanout line has an end substantially aligned with the substrate; and
   making the first data line electrically connected to the common line.

8. The method of claim 7, wherein making the first data line electrically connected to the common line comprises making the common line have a protrusion by laser, and the protrusion extends toward the first data line and is in contact with the first data line.

9. The method of claim 7, wherein cutting the mother board comprises cutting the mother board along a cutting line, and the cutting line passes through the display region.

10. The method of claim 7, further comprising:
   after making the first data line electrically connected to the common line, making the first pixel unit and the second pixel unit be in a dark state.

* * * * *